United States Patent

Hwang et al.

[11] Patent Number: 6,072,726
[45] Date of Patent: Jun. 6, 2000

[54] METHOD FOR COPYING FLASH MEMORY WITH DUPLEXED PROCESSOR BOARD

[75] Inventors: Seong Geun Hwang; Kum Young Lee, both of Kyungki-do, Rep. of Korea

[73] Assignee: LG Information & Communications, Ltd., Seoul, Rep. of Korea

[21] Appl. No.: 09/190,614

[22] Filed: Nov. 12, 1998

[30] Foreign Application Priority Data

Dec. 31, 1997 [KR] Rep. of Korea .................... 97-82204

[51] Int. Cl.[7] ................................................ G06F 13/00
[52] U.S. Cl. ........................... 365/185.33; 365/189.01; 395/800.37; 395/651; 395/652; 395/828; 711/103
[58] Field of Search ..................................... 395/651, 652, 395/828, 800.37; 365/185.33, 189.01; 711/103

[56] References Cited

U.S. PATENT DOCUMENTS

| 4,454,596 | 6/1984 | Wunsch et al. ........................ 361/680 |
| 5,651,787 | 7/1997 | Amorim et al. .................... 395/500.34 |
| 5,652,886 | 7/1997 | Tulpule et al. ......................... 395/652 |

*Primary Examiner*—Viet Q. Nguyen
*Attorney, Agent, or Firm*—Fleshner & Kim

[57] ABSTRACT

The present invention discloses a method for copying flash memories of multiple processor boards without the need of a separate copying device. Particularly, the present invention discloses a system with a duplex processor boards and inserting the flash memories onto the processor boards. Afterwards, the program is loaded into the flash memory of one processor and transferred to the flash memory of the other processor.

20 Claims, 7 Drawing Sheets

METHOD FOR COPYING FLASH MEMORY WITH DUPLEXED PROCESSOR BOARD

FIELD OF THE INVENTION

The present invention relates to a method for copying flash memory of a processor and more particularly for copying flash memory of a duplex processor.

DISCUSSION OF THE RELATED ART

Generally, electronic devices for data processing have multiple processor boards with installed flash memory packets storing various programs. For an electronic device such as a computer, a program may be loaded through a RAM memory from the hard drive or may be loaded from a flash memory packet inserted through one of a plurality of slots in a computer. To load a program from a flash memory packet, the program must first be copied onto the flash memory packet.

Up until now, a separate device such as an EPROM writer was utilized to copy a program onto a flash memory packet. The computer may have a plurality of slots and a plurality of flash memory packets from which one or more flash memory packets are inserted into a corresponding number of slots. Once the flash memory packets are inserted, the EPROM copies the appropriate programs onto the flash memory packets. To distinguish and identify each flash memory packet inserted in one of the plurality of slots, the EPROM writer attaches an ID label on the flash memory packet indicating the copied program.

Figure 1:
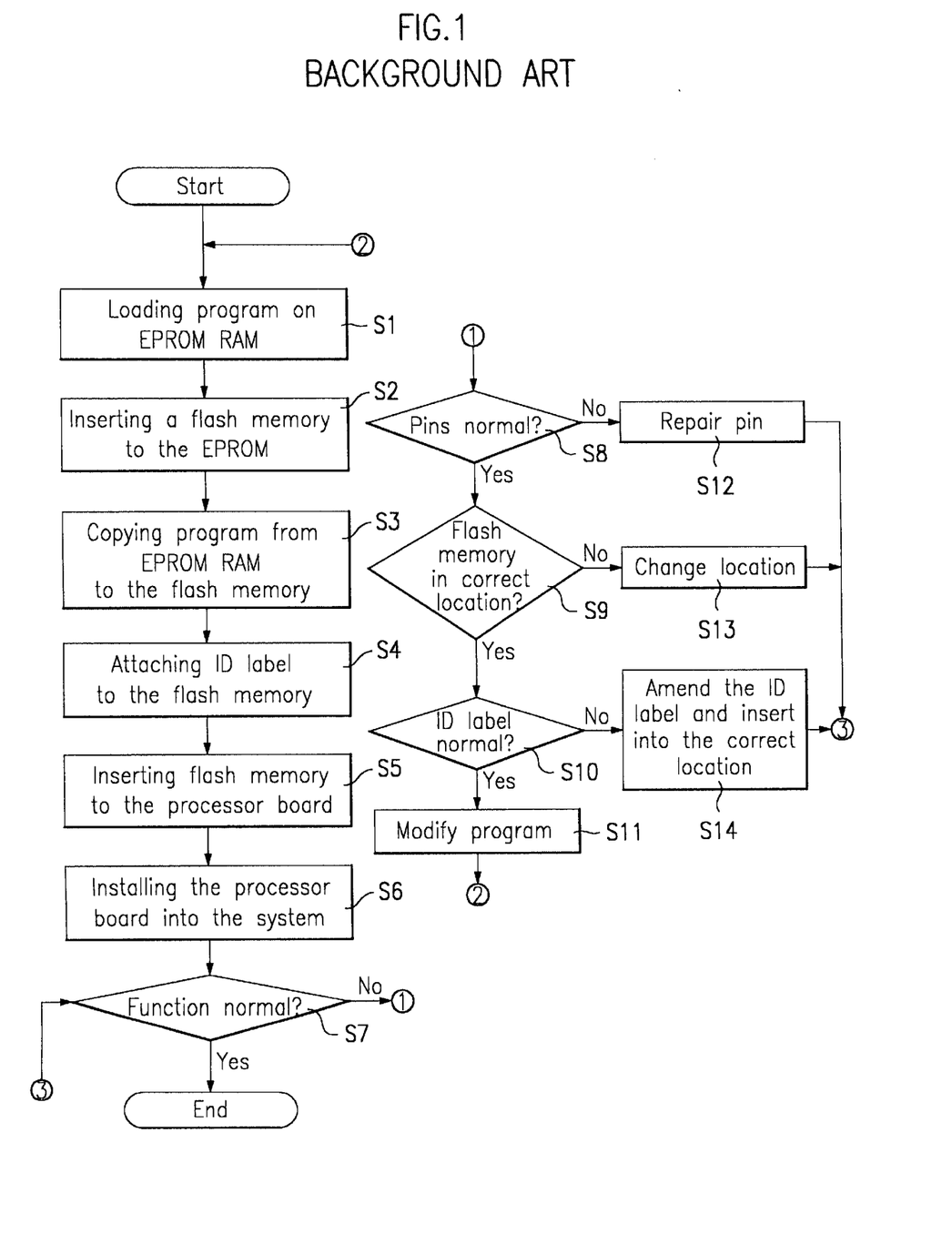
FIG. 1 is a flowchart for copying a program onto a flash memory using an EPROM.

FIG. 1 shows a the procedure for copying a program onto a flash memory using an EPROM memory. First in step (s1), a program is loaded into the RAM of the EPROM. Afterwards, a flash memory is inserted to the EPROM (s2) and the program stored in the EPROM RAM is copied onto the flash memory (s3) with a ID label to distinguish the copied program (s4). The copied flash memory is inserted into the appropriate location of the processor board (s5) and the processor board is installed into a data processing system (s6). The stored program is tested to determine if the program was accurately copied and inserted into the processor board (s7). If the program is successfully loaded onto the processor board, the copying procedure ends.

If the program cannot be loaded onto the processor board, the insertion pins of the flash memory are first examined (s8). If one or more pins are defective, the pins are repaired (s9) and the stored program is retested (s7), but if the pins are normal, the flash memory location is checked for mistakes (s9). If the flash memory was inserted into the wrong location, the flash memory is inserted into the correct location (s13) and the stored program is retested (s7), but if the flash memory was inserted into the proper location, the ID label is checked for mislabeling (s10). If the flash memory was mislabeled, the ID label is amended and the flash memory is re-inserted into the processor board (s14) for retesting of the program (s7). However, if the flash memory was accurately labeled, the program itself is determined to have been incorrectly copied (s11) and the program is reloaded on the RAM of the EPROM (s1). Thus, an EPROM copies a program onto a flash memory as described above.

However, the cost of copying one flash memory using an EPROM writer is high, which significantly lowers the economical efficiency of utilizing a flash memory packet. Also during the ID labeling of a multiple flash memory packets, the EPROM writer may mix up the ID labels among the multiple flash memory packet. If a mislabeling error occurs, it takes a substantial amount of time to discover and correct the mistake which prolongs the installation to the processor board. Moreover, even if the program was correctly copied and labeled, an error may arise during the insertion of the packet into the computer slot causing a malfunction of the processor board. For example, the flash memory packet may be inserted into the wrong computer slot or an insertion pin may be slightly bent. Because the possibility of numerous types of errors, it is often difficult to just discover the origination of the malfunction.

OBJECTIVES OF THE INVENTION

An object of the present invention is to solve at least the problems and disadvantages of the related art.

Particularly, an object of the present invention is to provide a method of copying a program onto a flash memory without the need of a separate copying device.

Another object of the present invention is to provide a method of copying a program onto a flash memory with minimal costs.

A further object of the present invention is to provide a method of accurately loading a program onto a duplex processor board.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWING

The invention will be described in detail with reference to the following drawings in which like reference numerals refer to like elements wherein.

DETAILED DESCRIPTION OF THE INVENTION

Figure 2:
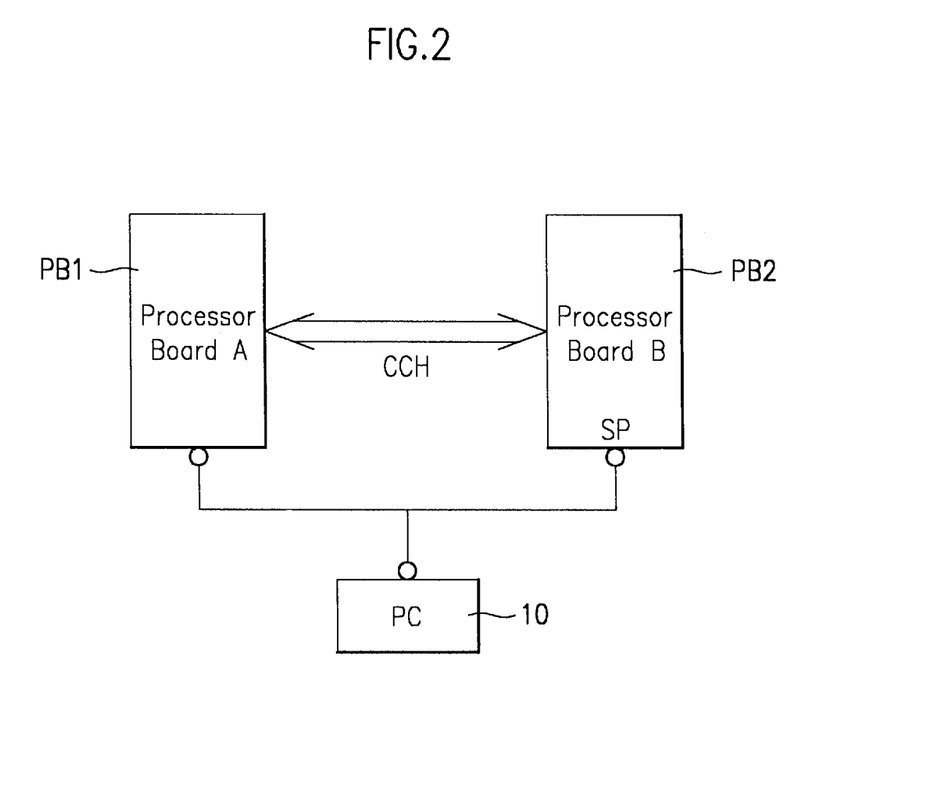
FIG. 2 shows a personal computer with a duplex processor board.

The present invention for copying a program onto a flash memory includes two processor boards. A personal computer (PC) 10 with two processor boards PB1, PB2 is shown in FIG. 2. The processor boards PB1 and PB2 are linked through the communication channel CCH and the input/output ports SP of the two processor boards are connected in parallel to the PC 10.

Figure 3:
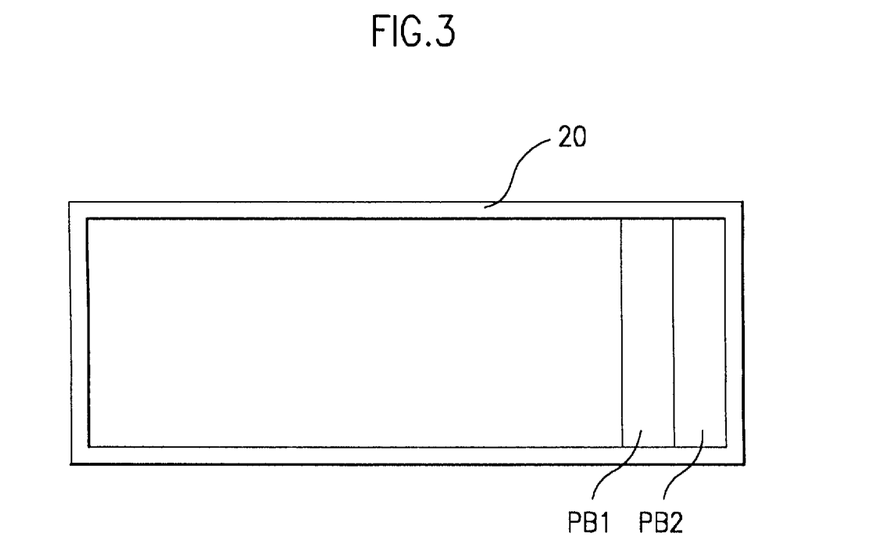
FIG. 3 shows a system rack.

Each processor board according to the present invention includes a RAM, a ROM, a flash memory and other control logic circuits. The duplex processor boards PB1 and PB2 exchanges messages through CCH and communicates with the PC 10 through SP. The duplex processors boards PB1, PB2 are installed into the system rack 30 as shown in FIG.

3. During the operation of the system, only one processor is active while the other processor is kept in a standby mode. If the active processor board develops a problem and becomes inoperative, the processor in the standby mode becomes active and carries forth the operation.

Figure 4:
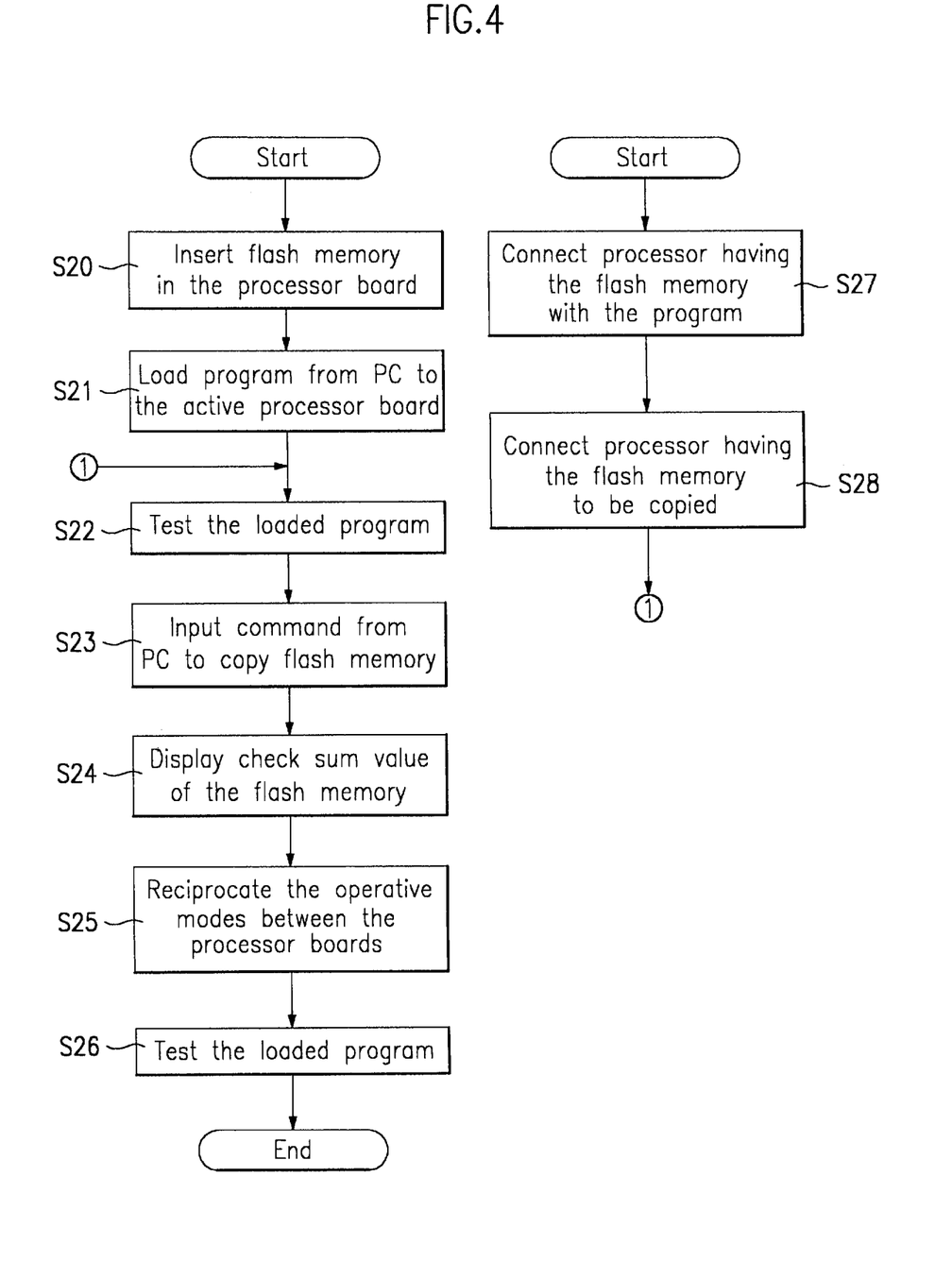
FIG. 4 is a flowchart for copying a program onto a flash memory according to the present invention.

FIG. 4 shows a preferred embodiment of a copying procedure according to the present invention. If neither of the processor boards PB1, PB2 has the program, the copying begins from step (s20), but if one of the processor boards already has the program, the copying begins from step (s27).

In the case where neither of the processor boards has the program, a flash memory is first inserted to the processors PB1 and PB2 (s20). The PC 10 loads the program to the flash memory of the active processor board (s21) and tests whether the program was successfully loaded (s22). If the program was successfully loaded, the PC 10 monitor displays a message indicating a successful loading of the program and the PC 10 outputs a command to copy the flash memory (s23). In response to the command, the program loaded in the flash memory of the active processor is copied onto the flash memory of the inactive processor. Upon completion of the copying, a check sum value is output to verify whether the program was accurately copied (s24). The check sum value is output in a way to determine the inaccurate portion of the flash memory in case the check sum value is incorrect. Afterwards, the active processor is switched to a standby mode while the standby processor is switched to an active mode and the operative modes of two processors are mutually communicated (s25), thereby testing whether the program was successfully copied from the flash memory of the previously active processor onto the flash memory of currently active processor (s26).

If one of the processor boards has a flash memory with a program already loaded, the processor having the flash memory with the program is connected to the PC 10 (s27) and the processor having the flash memory to be copied is also connected to the PC 10 (s28). The processor with the program is designated as the active processor and the processor without the program is designated into a standby mode. After testing the program loaded onto the flash memory of the active processor (s22), the program is copied onto the flash memory of the processor in the standby mode as in steps (s23–s26).

Figure 5A:
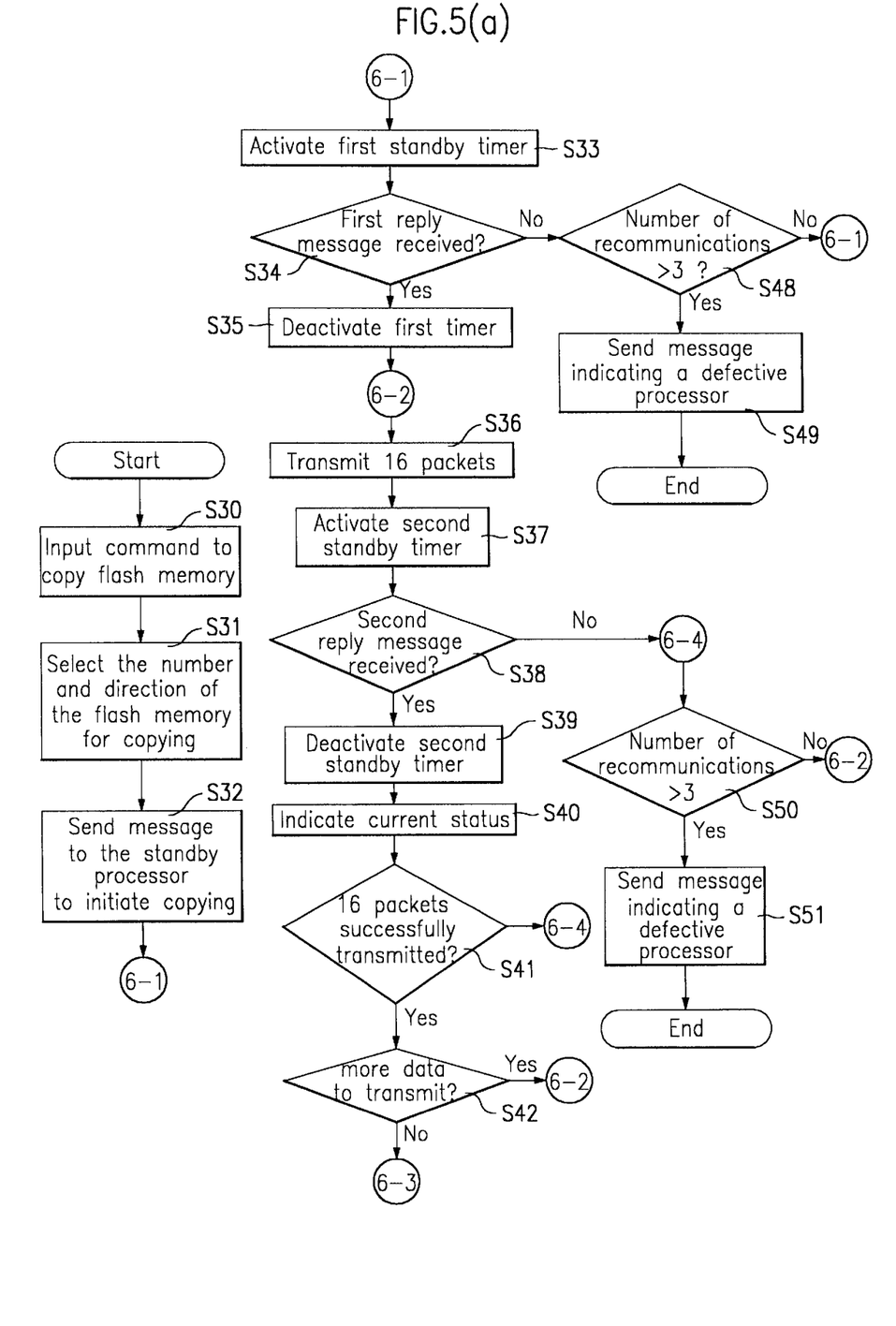
FIGS. 5(a) and (b) are flowcharts showing the operation of the active processor in FIG. 4 during a copying of a flash memory.
Figure 5B:
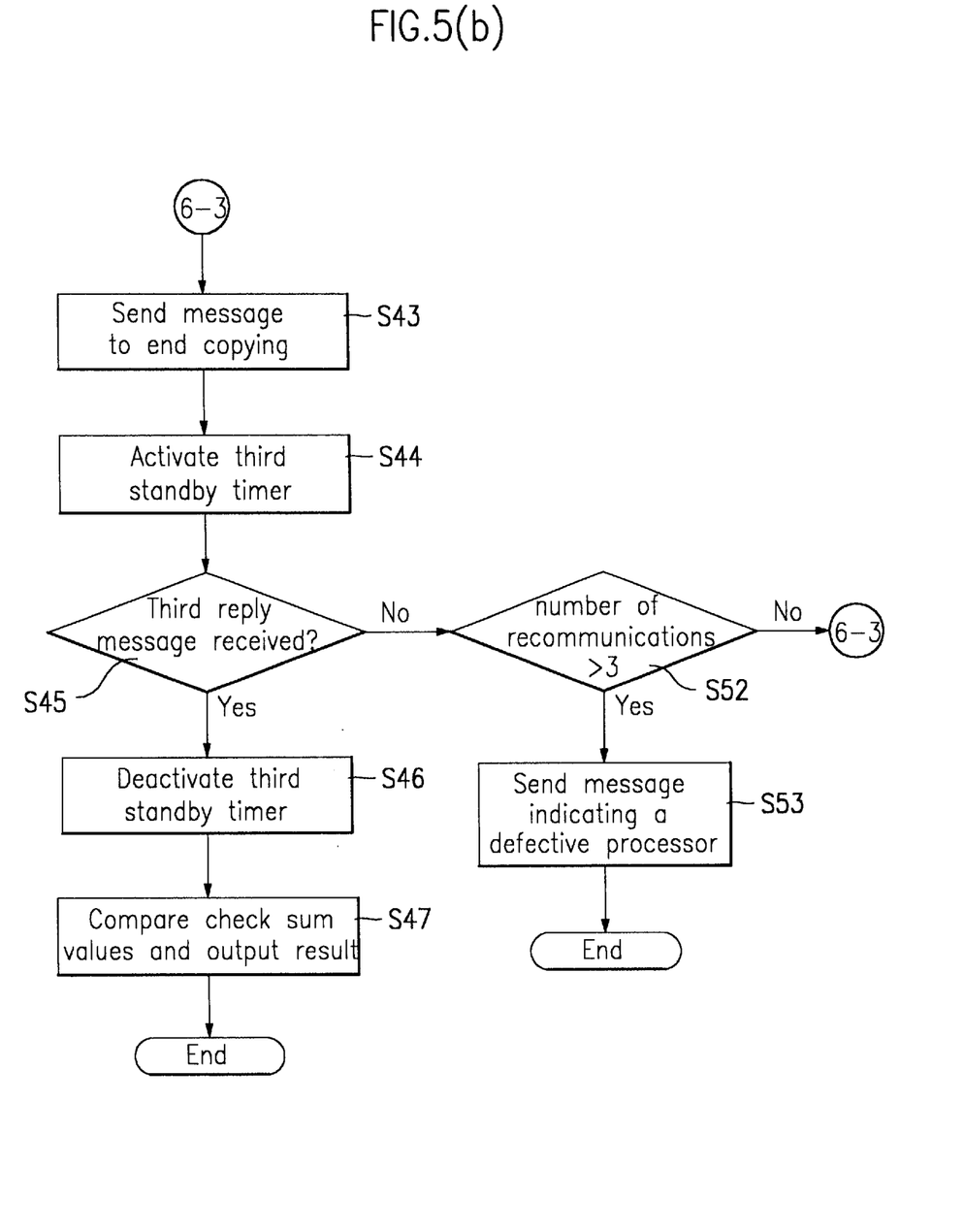

The operation of the active processor during the copying of the flash memory will be explained with reference to FIGS. 5(a) and (b). When the active processor receives the command from the PC 10 to initiate copying (s30), a selection menu for choosing the flash memory to be copied and the copying direction are displayed on monitor of the PC 10. Once the number of the flash memory to be copied and the direction to copy the flash memory within the standby processor are designated (s31), a message to begin copying is communicated to the standby processor (s32). A first reply waiting timer is activated and set for approximately 5 seconds (s33) to verify whether a first reply message indicating that the standby processor has received the copying command has been sent within the set duration (s34). If the first reply message has not been received, the message to begin copying is recommunicated to the standby processor three more times (s48). However, if a reply message is not received even after the recommunications, a message that the standby processor is defective is output to the PC 10 (s49). If a first reply message has been received from the standby processor, the first reply waiting timer is deactivated (s35) and the copying begins.

The program in the designated flash memory is read one packet (one packet consisting 24 byte) at a time consecutively for sixteen packets and is transmitted sequentially to the standby processor (s36). Upon sending the first packet, a second reply waiting timer is activated and set for approximately 5 seconds (s37) to verify whether a second reply message indicating that the standby processor has received the first packet has been sent within the set duration (s38). If the second reply message has not been received, the packets are retransmitted to the standby processor three more times (s50). However, if a reply message is not received even after the recommunications, a message that the standby processor is defective is output to the PC 10 (s51). If a second reply message has been received from the standby processor, the second reply waiting timer is deactivated (s39).

While the packets are being transmitted for copying, the status of the transmittal process is output to the PC 10 (s40) and once a successful transmission is verified (s41), a determination is made whether more packets need to be transmitted (s42). If more packets need to be transmitted, the process returns to step (s35) and if all transmission is completed, a message to end copying is communicated to the standby processor (s43). A third reply waiting timer is activated and set (s44) to verify whether a third reply message indicating that the standby processor has received the stop command has been sent within the set duration (s45). If the third reply message has not been received the message to end copying is recommunicated to the standby processor three more times (s52). However, if a reply message is not received even after the recommunications, a message that the standby processor is defective is output to the PC 10 (s53). If a third reply message has been received from the standby processor, the third reply waiting timer is deactivated (s46).

When the copying procedure ends, the check sum value of the active processor and check sum value of the standby processor are compared, and the result is output to the monitor of the PC 10 (s47). If the comparison result is satisfactory, the appropriate ID label to be attached to the copied flash memory is output to the PC 10 monitor. If the comparison result is unsatisfactory, the number of the copied flash memory is output to the PC 10 monitor. Thus, the active processor during the copying of the flash memory operates as discussed above.

Figure 6A:
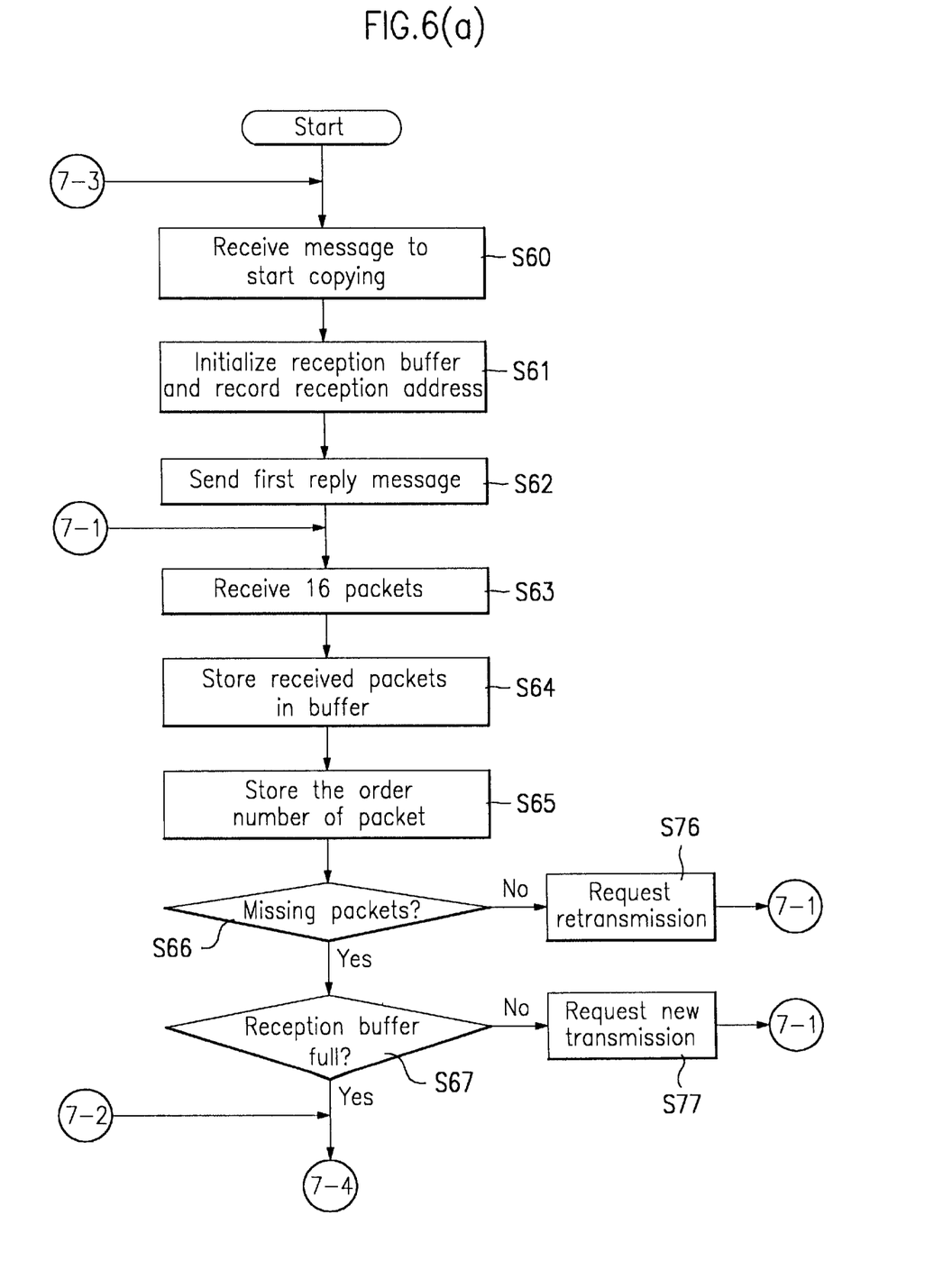
FIGS. 6(a) and (b) are flowcharts showing the operation of the standby processor in FIG. 4 during a copying of a flash memory.
Figure 6B:
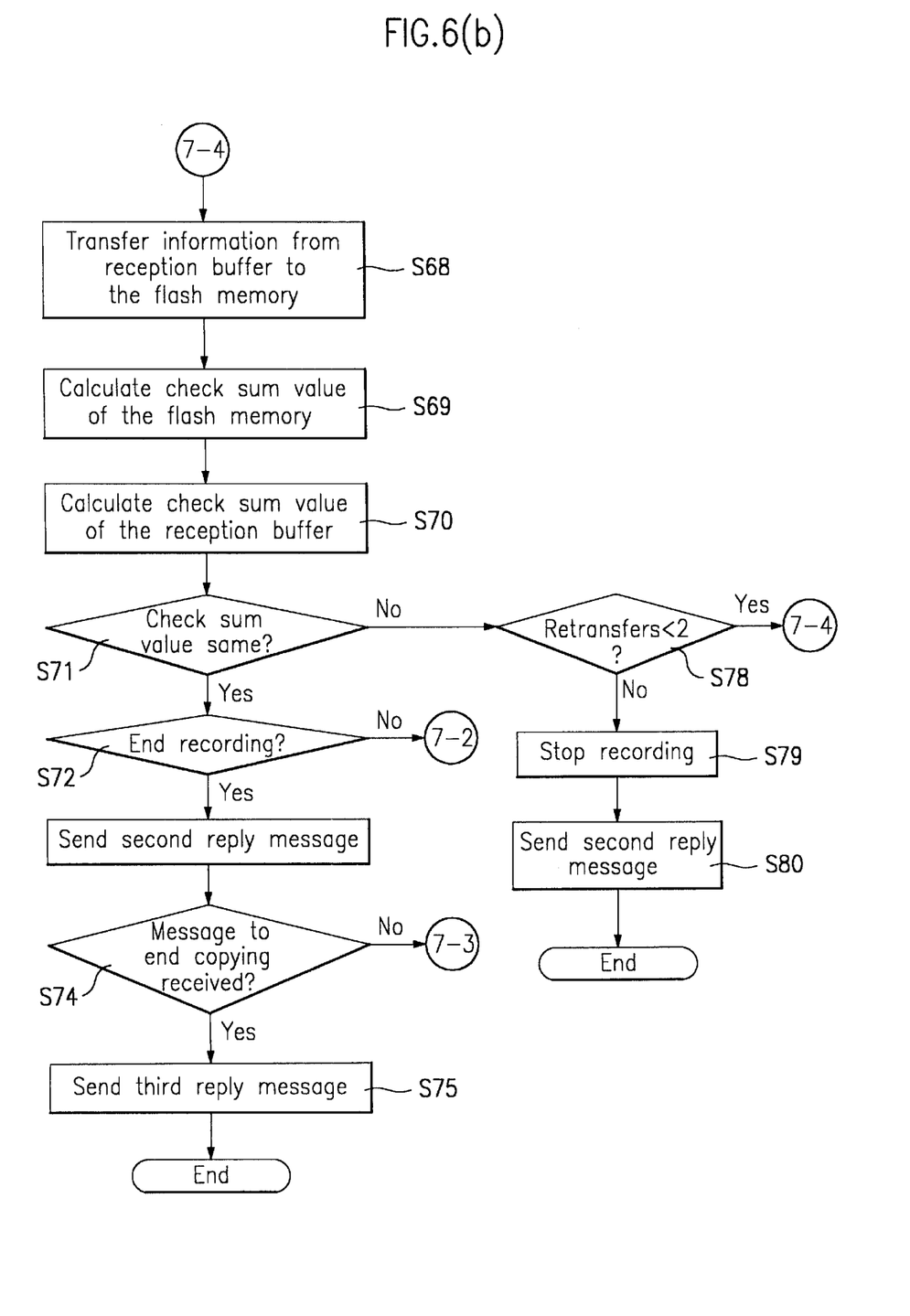

The operation of the standby processor during the copying of the flash memory will be explained next with reference to FIGS. 6(a) and (b). Upon receiving a message from the active processor to begin copying (s60), the standby processor initializes the reception buffer and records the start address for reception incorporated within the copying message (s61). Afterwards, the standby processor sends the first reply message indicating that the copying message has been received (s62) and starts to receive the packets transmitted from the flash memory of the active processor board. The packets are received sequentially one packet at a time for 16 packets (s63) and are stored in the reception buffer (s64). The numbers corresponding to the sequential order of the packets are also stored (s65) to later check for any missing packets (s66).

If some packets are missing, the standby processor requests a retransmission of the sixteen packets from the active processor (s76). If all packets were received, the standby processor determines whether the reception buffer is full (s67). If the reception buffer is not full, the standby processor requests new transmission of more packets from the active processor (s77). If the reception buffer is full, the information stored in the reception buffer is transferred and recorded onto the flash memory in units of 512 bytes (s68).

The check sum value of the recorded 512 bytes in the flash memory is calculated (s69) and the check sum value of the originally received 512 bytes in the reception buffer is calculated (s70) to verify whether the two check sum values correspond (s71).

If the check sum values do not correspond, the information stored in the reception buffer is retransferred and rerecorded onto the flash memory in units of 512 bytes two more times (s78) and the check sum values are recalculated. If the check sum values do not correspond even after the retransfers, the recording of the flash memory is suspended (s79) and the second reply message is sent to the active processor (s80). If the check sum values do correspond, the standby processor verifies whether all the information from the reception buffer has been recorded onto the flash memory (s72).

If all the information has not been recorded onto the flash memory, the process returns to step (s68). If all the information has been recorded, the second reply message is sent to the active processor (s73) and checks for a message from the active processor to end copying (s74). If the standby processor does not receive the end message from the active processor, the process returns to step (s60). If the end message is received the standby processor sends the third reply message to the active processor (s75) and ends the copying procedure.

Therefore, a flash memory according to the present invention is copied using a duplex processor boards without the need for an additional copying device such as an EPROM writer. Also, by having the flash memories inserted and onto the processor boards, an error due to faulty insertions can be avoided.

Moreover, although the invention has been described with two processors, the number of processors may be varied according to the needs of the system. Likewise, although the number of recommunications has been set to either two or three, it may be set to a higher or lower number as deemed appropriate to the needs of the system.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for copying flash memory in a system with one active processor board and at least one standby processor board, comprising the steps of:

inserting at least one flash memory in each processor board;

connecting each processor board to the system;

loading a program to a flash memory of the active processor board; and inputting a command to copy the program from a flash memory of the active processor board to a flash memory of a standby processor board.

2. A method for copying flash memory in a system with a program loaded onto a flash memory of at least a processor board, comprising the steps of:

inserting at least one flash memory in each of the plurality of processor boards without the program;

designating the processor board with the program as an active processor board and designating each of the plurality of processor boards without the program as standby processor boards;

connecting the active processor board and each standby processor board to the system; and inputting a command to copy the program from a flash memory of the active processor board to a flash memory of a standby processor board.

3. A method for copying flash memory of claim 1, further comprising the steps of:

testing whether the program was properly loaded onto the active processor board.

4. A method for copying flash memory of claim 2, further comprising the steps of:

testing whether the program was properly loaded onto the active processor board.

5. A method for copying flash memory of claim 1, further comprising the steps of:

displaying a check sum values to verify whether the program was accurately copied onto the standby processor board.

6. A method for copying flash memory of claim 2, further comprising the steps of:

displaying a check sum values to verify whether the program was accurately copied onto the standby processor board.

7. A method for copying flash memory of claim 1, further comprising the steps of:

reciprocating the operative modes of the processor boards by designating the active processor board as a new standby processor board and designating the standby processor board as a new active processor board;

testing whether the program was properly loaded onto the new active processor board.

8. A method for copying flash memory of claim 2, further comprising the steps of:

reciprocating the operative modes of the processor boards by designating the active processor board as a new standby processor board and designating the standby processor board as a new active processor board;

testing whether the program was properly loaded onto the new active processor board.

9. A method for copying flash memory of claim 1, further comprising the steps of:

inputting a command to copy the program by sending a message to the standby processor board to initiate copying;

sending a first reply message from the standby processor confirming the receipt of the copy command;

activating and setting a first timer for a first predetermined time period;

checking whether the first reply message has been received from the standby processor board within said first predetermined time period;

resending the copy command to the standby processor board up to a first predetermined number if the first reply message has not been received within said first predetermined time period;

deactivating the first timer if the first reply message has been received within said first predetermined time period, and sending a message indicating a defective processor if the first reply message is not received within said first predetermined time period after resending the copy command for said first predetermined number of times.

10. A method for copying flash memory of claim 2, further comprising the steps of:

inputting a command to copy the program by sending a message to the standby processor board to initiate copying;

sending a first reply message from the standby processor confirming the receipt of the copy command;

activating and setting a first timer for a first predetermined time period;

checking whether the first reply message has been received from the standby processor board within said first predetermined time period;

resending the copy command to the standby processor board up to a first predetermined number if the first reply message has not been received within said first predetermined time period;

deactivating the first timer if the first reply message has been received within said first predetermined time period, and sending a message indicating a defective processor if the first reply message is not received within said first predetermined time period after resending the copy command for said first predetermined number of times.

11. A method for copying flash memory of claim 9, further comprising the steps of:

transmitting the program in units of 16 packets if the first reply message has been received within the said first predetermined time period;

sending a second reply message from the standby processor confirming the receipt of the program;

activating and setting a second timer for a second predetermined time period;

checking whether the second reply message has been received from the standby processor board within said second predetermined time period;

retransmitting the program to the standby processor board up to a second predetermined number if the second reply message has not been received within said second predetermined time period;

deactivating the second timer if the second reply message has been received within said second predetermined time period, and sending a message indicating a defective processor if the second reply message is not received within said second predetermined time period after resending the copy command for said second predetermined number of times.

12. A method for copying flash memory of claim 10, further comprising the steps of:

transmitting the program in units of 16 packets if the first reply message has been received within the said first predetermined time period;

sending a second reply message from the standby processor confirming the receipt of the program;

activating and setting a second timer for a second predetermined time period;

checking whether the second reply message has been received from the standby processor board within said second predetermined time period;

retransmitting the program to the standby processor board up to a second predetermined number if the second reply message has not been received within said second predetermined time period;

deactivating the second timer if the second reply message has been received within said second predetermined time period, and sending a message indicating a defective processor if the second reply message is not received within said second predetermined time period after resending the copy command for said second predetermined number of times.

13. A method for copying flash memory of claim 11, further comprising the steps of:

transmitting the program in units of 16 packets by transmitting packet by packet consecutively for 16 packets if the first reply message has been received within the said first predetermined time period;

storing the 16 packets in sequential order in a buffer of the standby processor board and storing the sequential order number of the 16 packets;

checking and determining whether any packets are missing using said sequential order number; and requesting a retransmission of the 16 packets if any packets are determined to be missing.

14. A method for copying flash memory of claim 12, further comprising the steps of:

transmitting the program in units of 16 packets by transmitting packet by packet consecutively for 16 packets if the first reply message has been received within the said first predetermined time period;

storing the 16 packets in sequential order in a buffer of the standby processor board and storing the sequential order number of the 16 packets;

checking and determining whether any packets are missing using said sequential order number; and requesting a retransmission of the 16 packets if any packets are determined to be missing.

15. A method for copying flash memory of claim 13, further comprising the steps of:

checking whether said buffer is full if none of the packets are determined to be missing;

requesting for new transmission of packets if said buffer is not full; and transferring and recording the 16 packets from said buffer to a flash memory of the standby processor if said buffer is full.

16. A method for copying flash memory of claim 14, further comprising the steps of:

checking whether said buffer is full if none of the packets are determined to be missing;

requesting for new transmission of packets if said buffer is not full; and transferring and recording the 16 packets from said buffer to a flash memory of the standby processor if said buffer is full.

17. A method for copying flash memory of claim 15, further comprising the steps of:

calculating a check sum value of the flash memory;

calculating a check sum value of the reception buffer;

comparing and determining if said check sum values of the flash memory and the reception buffer correspond;

retransferring and rerecording the 16 packets from said buffer to a flash memory of the standby processor up to a fourth predetermined number, if said check sum values are determined not to correspond;

ending the transfer and recording of the 16 packets if said check sum values are determined to correspond; and stopping the transfer of the 16 packets and sending the second reply message from the standby processor board.

18. A method for copying flash memory of claim 16, further comprising the steps of:

calculating a check sum value of the flash memory;

calculating a check sum value of the reception buffer;

comparing and determining if said check sum values of the flash memory and the reception buffer correspond;

retransferring and rerecording the 16 packets from said buffer to a flash memory of the standby processor up to a fourth predetermined number, if said check sum values are determined not to correspond;

ending the transfer and recording of the 16 packets if said check sum values are determined to correspond; and stopping the transfer of the 16 packets and sending the second reply message from the standby processor board.

19. A method for copying flash memory of claim 11, further comprising the steps of:

checking whether there are more packets to be transmitted to the standby processor board;

transmitting the program in units of 16 packets if more packets need to be transmitted;

sending a command to end copying to the standby processor board if there are no more packets to be transmitted;

sending a third reply message from the standby processor confirming the receipt of the end copy command;

activating and setting a third timer for a third predetermined time period;

checking whether the third reply message has been received from the standby processor board within said third predetermined time period;

resending the end copy command to the standby processor board up to a third predetermined number if the third reply message has not been received within said third predetermined time period;

deactivating the third timer if the third reply message has been received within said third predetermined time period, and sending a message indicating a defective processor if the third reply message is not received within said third predetermined time period after resending the copy command for said third predetermined number of times.

20. A method for copying flash memory of claim 12, further comprising the steps of:

checking whether there are more packets to be transmitted to the standby processor board;

transmitting the program in units of 16 packets if more packets need to be transmitted;

sending a command to end copying to the standby processor board if there are no more packets to be transmitted;

sending a third reply message from the standby processor confirming the receipt of the end copy command;

activating and setting a third timer for a third predetermined time period;

checking whether the third reply message has been received from the standby processor board within said third predetermined time period;

resending the end copy command to the standby processor board up to a third predetermined number if the third reply message has not been received within said third predetermined time period;

deactivating the third timer if the third reply message has been received within said third predetermined time period, and sending a message indicating a defective processor if the third reply message is not received within said third predetermined time period after resending the copy command for said third predetermined number of times.

* * * * *